(12) United States Patent
Hiruta

(10) Patent No.: US 6,182,828 B1
(45) Date of Patent: Feb. 6, 2001

(54) REEL TAPE FOR PROVISIONALLY SUPPORTING A BARE CHIP

(75) Inventor: Yoichi Hiruta, Kashiwa (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/302,961

(22) Filed: Apr. 30, 1999

Related U.S. Application Data

(62) Division of application No. 08/801,473, filed on Feb. 18, 1997, now Pat. No. 5,952,841.

(30) Foreign Application Priority Data

Feb. 19, 1996 (JP) ..................................................... 8-030754

(51) Int. Cl.⁷ ............................ B65D 73/02; B65D 81/05; H01L 23/02
(52) U.S. Cl. ........................... 206/713; 206/389; 206/411; 226/93; 414/935
(58) Field of Search ............................... 226/93; 206/389, 206/411, 713, 714; 414/222, 935

(56) References Cited

U.S. PATENT DOCUMENTS

| | | | |
|---|---|---|---|
| 4,818,726 | * 4/1989 | Flaten | 437/207 |
| 4,956,605 | 9/1990 | Bickford et al. | 324/760 |
| 5,076,427 | * 12/1991 | Thomson et al. | 206/330 |
| 5,189,363 | 2/1993 | Bregman et al. | 324/754 |
| 5,232,532 | * 8/1993 | Hori | 156/163 |
| 5,318,181 | * 6/1994 | Stover et al. | 206/459.1 |
| 5,510,724 | 4/1996 | Itoyama et al. | 324/760 |
| 5,561,386 | 10/1996 | Funaki et al. | 324/758 |
| 5,578,919 | 11/1996 | Semba et al. | 324/158.1 |
| 5,614,837 | 3/1997 | Itoyama et al. | 324/760 |
| 5,931,337 | * 8/1999 | Ando et al. | 221/1 |

* cited by examiner

Primary Examiner—Glenn W. Brown
(74) Attorney, Agent, or Firm—Finnegan, Henderson, Farabow, Garrett & Dunner, L.L.P.

(57) ABSTRACT

A reel tape includes a base tape for reel winding, a chip mounting section on the base tape, on which a bare chip is to be mounted and an adhesive layer coated on the chip mounting section. The bare chip is provisionally bonded to the chip mounting section with the adhesive layer interposed therebetween such that the bare chip is detachable. Therefore, the bare chip can be detached from the tape for chip testing, for example, and mounted on the tape again after the testing. The reel tape further includes a protector, e.g. a bar, provided on the base tape and along the chip mounting section in a tape conveying direction. The protector prevents the bare chip from contacting an overlaying portion of the base tape when the base tape is wound on a reel.

4 Claims, 5 Drawing Sheets

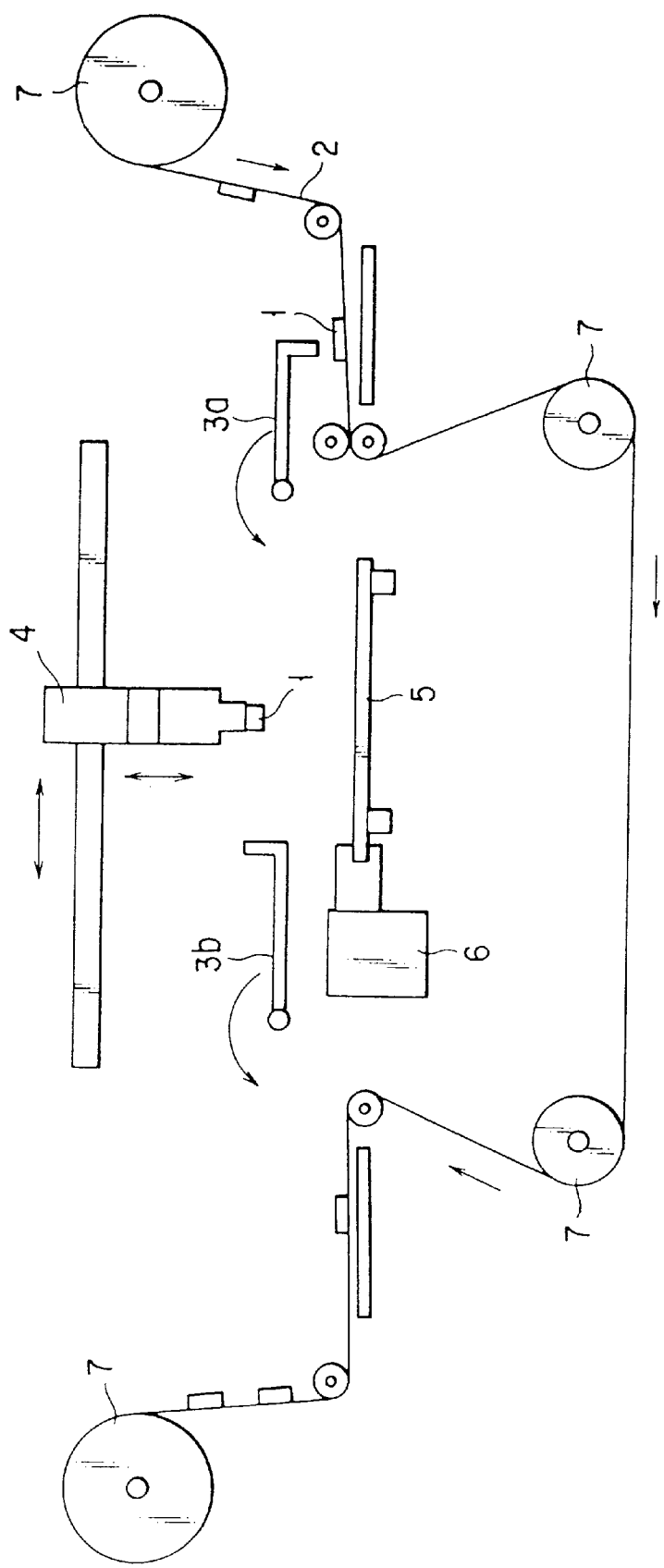
F I G. 1

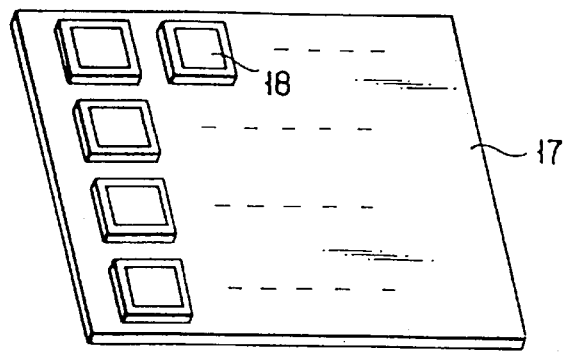
F I G. 5

REEL TAPE FOR PROVISIONALLY SUPPORTING A BARE CHIP

This is a division of application Ser. No. 08/801,473, filed Feb. 18, 1997 now U.S. Pat. No. 5,952,841, all of which are incorporated herein by reference.

BACKGROUND OF THE INVENTION

1. Field of the Invention

The present invention relates to a bare chip prober device for a bare chip operation test and burn-in test and a bare chip handling method and, in particular, to a device adapted to mount a bare chip on a test board or burn-in board in a bare chip operation testing or burn-in testing and a tape reel with bare chips carried thereon.

2. Description of the Related Art

In the case where a bare chip with, for example, solder or gold bumps formed thereon is to be mounted on a substrate in a flip-chip fashion, it is necessary to use a bare chip whose operation reliability is ensured. In order to prove the reliability, a burn-in test is carried out.

At the burn-in test, unlike a semiconductor device mounted in a package, the bare chip cannot be mounted directly on a burn-in board. As shown in FIG. 7A, the bare chip 1 is mounted on a carrier 22 and the carrier 22 is held in place in a socket above the burn-in board. In this way, the reliability test is carried out.

FIGS. 8A to 8C show the conventional method for mounting the bare chip 1 on the carrier.

Bump electrodes 25 are formed on the chip 1 and formed of, for example, a high-melting-point 90-Pb/10 Sn solder. An electrode 26 is provided on the carrier 22 and an eutectic solder 27 is provided on the electrode 26. The bare chip 1 is placed on the carrier 22 in a manner to set the bump electrode 25 in contact with the eutectic solder 27 above the electrode 26. Then, the eutectic solder 27 is melted to allow the bump electrode 25 to be soldered to the electrode 26.

In the method for mounting the bare chip 1 on the carrier 22 by soldering, after the test has been done, it is necessary to separate the chip 1 away from the carrier 22 so that the chip 1 may be actually mounted on a substrate. For this reason, there is a high possibility that damage will be caused to the bump electrode 25 and chip 1. This method can be applied to the bump electrode using a high-melting-point solder, but it cannot be used for an eutectic solder and gold bump electrodes, thus presenting a problem.

FIG. 9 shows another method for mounting the bare chip on the carrier.

Solder bump electrodes 8 are provided on the chip 1. First, the chip 1 is located in an interposer 29 which is, in turn, located on the carrier 22. Thereafter, a cover 21 with rubber 20 attached to its lower surface is placed over the carrier 22 with the interposer 29 and chip 1 in between and is fixed to the carrier 22 by a fastening means 28. As a result, the chip 1 is held in the carrier 22 with the interposer 29 in between.

This method poses the problem with the chip-to-carrier alignment as well as the manufacturing accuracy of the chip and carrier. The greater the number of the bumps 8, the more difficult it is to achieve adequate accuracy so that all the bumps on the chip 1 are contacted with the corresponding electrodes of the carrier 22.

Bare chips 1 are conveyed to a chip tray 19 as shown in FIG. 7B, before and after the test, in a manner to be carried on the chip tray 19.

In the case where the chips 1, being carried on the chip tray 19, is handled, it takes a lot of time to place the bare chips onto the chip tray 19 or it is necessary to wash the chip tray 19 or to use a different chip tray if the size of the chips 1 is different, thus preventing the problem of preparing more chip trays of different sizes.

In the case where the carrier is used, it has to be manually handled in a bare chip operation confirmation test to be done before and after the burn-in process, thus lowering the test efficiency.

BRIEF SUMMARY OF THE INVENTION

It is accordingly an aspect of the present invention to provide a high-throughput reliability evaluation system involving less damage to chips, which can be achieved with the use of a chip mounting device having an aligning mechanism and a test board for the chip mounting device and a chip conveying tape.

This aspect of the present invention can be achieved by the following arrangement.

A bare chip prober apparatus includes:
  a first pickup mechanism for picking up a semiconductor bare chip having an initial orientation from a reel tape with a plurality of semiconductor bare chips carried thereon and for setting a bare chip in a substantially inverted orientation;
  an aligning/mounting mechanism for aligning the picked-up semiconductor bare chip with a board for testing and for detaching the semiconductor bare chip from the board after the test has been finished; and
  a second pickup mechanism for setting the detached semiconductor bare chip onto the reel tape.

Another aspect of the invention includes a reed tape having:
  a chip mounting section adapted to allow a bare chip to be bonded thereto and mounted in place thereon;
  a protection member provided along a tape conveying direction and adapted to prevent contacting between the chip and the tape when the tape is wound; and
  a tape bending area provided at a forward end and back end of, and near, the chip mounting section in the tape conveying direction and providing a bendable thin-walled area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows a chip mounting device according to a first embodiment of the present invention;

FIG. 5 is a view showing a burn-in board for use in the chip mounting device of the present invention;

FIG. 9 is a view showing a conventional method for mounting a bare chip on a carrier with an interposer in between.

DETAILED DESCRIPTION OF THE INVENTION

Figure 2:
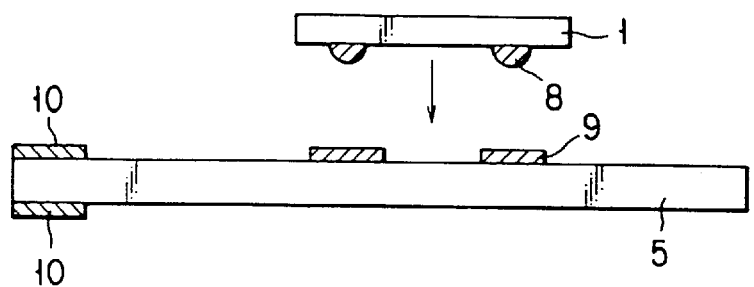
FIG. 2 is a view showing a test board for use in the chip mounting device of the present invention.

The embodiment of the present invention will be explained below with reference to the accompanying drawings.

FIG. 1 shows a first embodiment of the present invention. In FIG. 1, the same reference numerals are employed to designate parts or elements corresponding to those in the previously mentioned drawings. And further explanation of these is omitted for brevity's sake.

A chip mounting device as shown in FIG. 1 includes an aligning mechanism and is used for a chip operation test to be done before and after the burn-in process.

The device comprises a conveying mechanism 7, a first flipping mechanism 3a, an aligning/mounting mechanism 4 and a second flipping mechanism 3b.

The conveying mechanism 7 sends out a reel tape 2 in accordance with the situation in which a test is carried out. Bare chips 1 are initially mounted on the reel tape 2.

The first flipping mechanism 3a picks up the bare chip 1 from the reel tape 2 to place the picked-up chip 1 in an inverted state.

The aligning/mounting mechanism 4 receives the inverted chip 1 from the first flipping mechanism 3a and the chip 1 is mounted at a prescribed position on a test board 5. Subsequently, the alignment/mounting mechanism 4 detaches the chip 1 from the test board 5.

The second flipping mechanism 3b enables the chip 1 which is detached by the aligning/mounting mechanism 4 to be again mounted onto the tape 2. The tape 2 is the same as that on which the pre-tested chip is mounted.

Further, a tester 6 is connected to the test board 5.

The embodiment as shown in FIG. 1 is used for the bare chip test carried out before and after the burn-in process. If a burn-in board is used in place of the test board 5, it is possible to perform the burn-in test.

FIG. 2 shows a structure of a test board 5 for use in the chip mounting device shown in FIG. 1.

The test board 5 is formed, for example, on a printed circuit board of glass epoxy or on a ceramic wiring board. Electrodes 9 are provided on the test board 5 in a manner to correspond to bump electrodes 8 on a chip 1. The electrode 9 is formed by plating a wiring layer of, for example, Cu or W with a metal such as Ni, Al, Sn. Further, a connector terminal 10 is provided on the test board 5 and connected by a connection cable to the tester 6 for use in testing the operation of the chip.

Figure 3A:
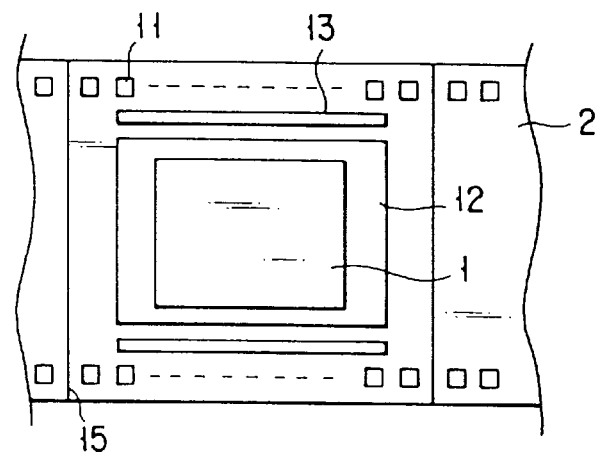
FIGS. 3A and 3B are views showing an exemplary form of a reel tape in the chip mounting device of the present invention.
Figure 3B:
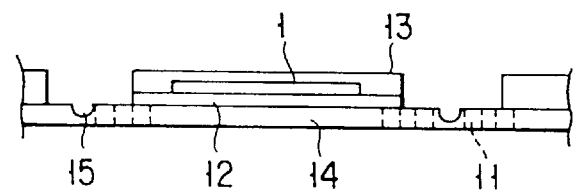

FIGS. 3A and 3B are a plan view and cross-sectional view, respectively, of a reel tape for use in the above-mentioned embodiment.

As shown in FIGS. 3A and 3B, the reel tape 2 has an adhesive 12 coated at its central area. For example, the rear surface of the chip 1 is bonded to the coated adhesive 12, that is, the coated adhesive layer. A protection bar 13 is provided at each side of the adhesive layer 12 in a position higher than the top surface of the chip 1. Perforation holes 11 are provided at an outer side of each protection bar 13. A groove 15 provides a corresponding thin-walled area so that the tape has bending areas.

Since the protection bar 13 is higher than the top surface of the chip 1 over the reel tape, it is possible to prevent the top surface of the chip 1 from being contacted with another tape surface and hence a semiconductor device from being damaged.

There is a possibility that the tape will not be bent during the winding of the tape 2 due to the presence of the protection bar 13. Since, however, the tape has the groove 15 providing thin-walled area at the bending area, it can be bent pliably.

Figure 4A:
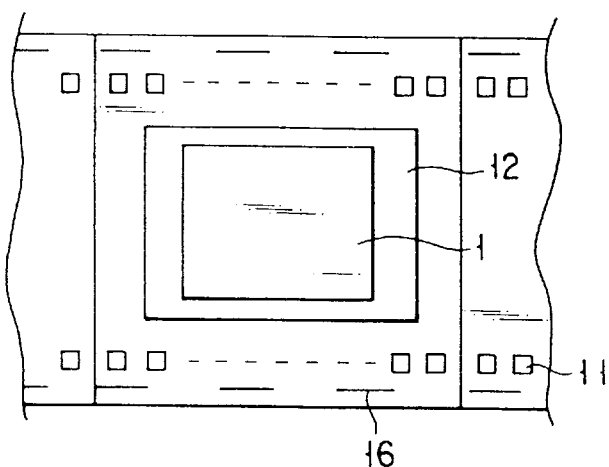
FIGS. 4A and 4B are views showing another exemplary form of a reel tape for use in the chip mounting device of the present invention.
Figure 4B:
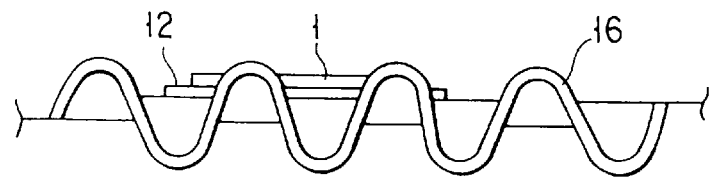
Figure 7A:
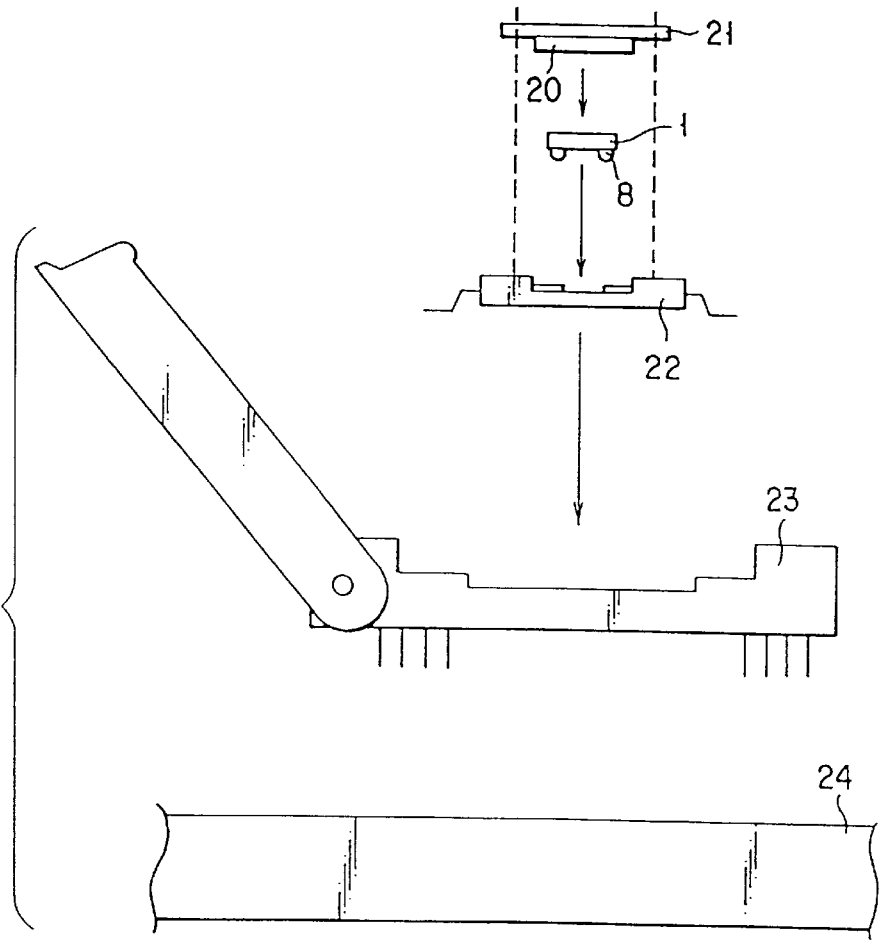
FIG. 7A is a view showing a conventional testing method.
Figure 7B:
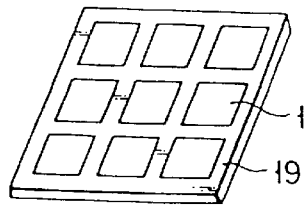
FIG. 7B is a view showing a conventional chip handling method.

FIGS. 4A and 4B are a plan view and cross-sectional view, respectively, of another form of a reel tape. This reel tape is used for the case where no damage is caused to the chip by another tape surface.

An adhesive 12 is coated as an adhesive layer on a central area of the tape 2 and a chip 1 is fixed to the coated adhesive layer 12. Perforation holes 11 are provided at each side of the tape and a wavy buffer area 16 is formed at each side of the tape 2 situated on the outer side of the perforation holes 11 area.

When the tape is wound, it can be pliably bent and it is possible to prevent a chip mount area from being bent.

FIG. 5 shows a burn-in board for use in the burn-in test in the embodiment shown in FIG. 1.

Carriers 18 for bare chips are mounted directly on a burn-in board 17 and fixed in place. Electrodes, not shown, are provided on the carrier 18 and bump electrodes on the semiconductor chip are placed on the above-mentioned electrodes. A plurality of carriers 18 are mounted on the burn-in board as shown in FIG. 5. The burn-in board, unlike the conventional board, uses no socket.

The handling of the bare chips in the above-mentioned chip mounting device will be explained below.

A wafer is diced into chips and the chips 1 are mounted on the tape, noting that the tape is wound into a reel form.

Then the reel tape 2 is mounted on the tape conveying mechanism 7 for the chip mounting device. The conveying mechanism 7, being operated, allows the tape 2 to be delivered. That surface of a chip opposite to a major surface of the chip is bonded to the tape 2 with a semiconductor element and bump electrodes formed on the major surface.

The chip 1 is picked up from the tape 2 by the first pickup mechanism 3a on the chip mounting device. The flipping mechanism 3a sets the chip 1 in an inverted state and the inverted chip is set on the aligning/mounting mechanism 4. That is, the chip is set in the aligning/mounting mechanism 4 in a manner to have the major surface of the chip 1 face the test board 5.

Then, with the use of the aligning/mounting mechanism 4, the bump electrodes 8 of the chip 1 are aligned on the corresponding electrodes 9 of the test board 5 and the chip 1 is mounted on the test board 5. For the burn-in tests, the chip 1 is accurately mounted on the carrier 18 on the burn-in board 17.

Thereafter, the chip 1 on the test board is measured, by the tester 6, for its characteristics and, for the case of the burn-in test, it is possible to carry out a burn-in test in the chip mount device.

After the test has been finished, the chip is taken off of the test board 5 by moving the chip mount mechanism 4 in a sequence opposite to that in which the chip is mounted.

By the second pickup mechanism 3b the chip 1 is again mounted on the tape 2. That is, the second pickup mechanism 3b receives the chip 1 from the aligning/mounting mechanism 4, the surface of the chip 1, for example, is inverted and the surface opposite to the major surface of the chip 1 is placed on the bonding surface of the tape at which time only a chip accepted as being good can be mounted on the tape. As a result, the reel tape with those accepted reliable chips thereon can be delivered for shipment.

According to the present embodiment, since the bump is not soldered to the board electrode, there occurs less damage to the chip and, as a material for the solder bump on the chip, use can be made of an eutectic solder.

Further, the accuracy with which the bumps of the chip are aligned with the test board can be improved due to the presence of the aligning/mounting mechanism.

Further, since the chips are conveyed by the tape, it is possible to handle a larger number of chips at a time and it is convenient to ship them.

When the chip is mounted on the substrate, it is possible to automatically pick up the chip from the tape and mount it in place and hence to largely improve the throughput of the test or burn-in.

Figure 6:
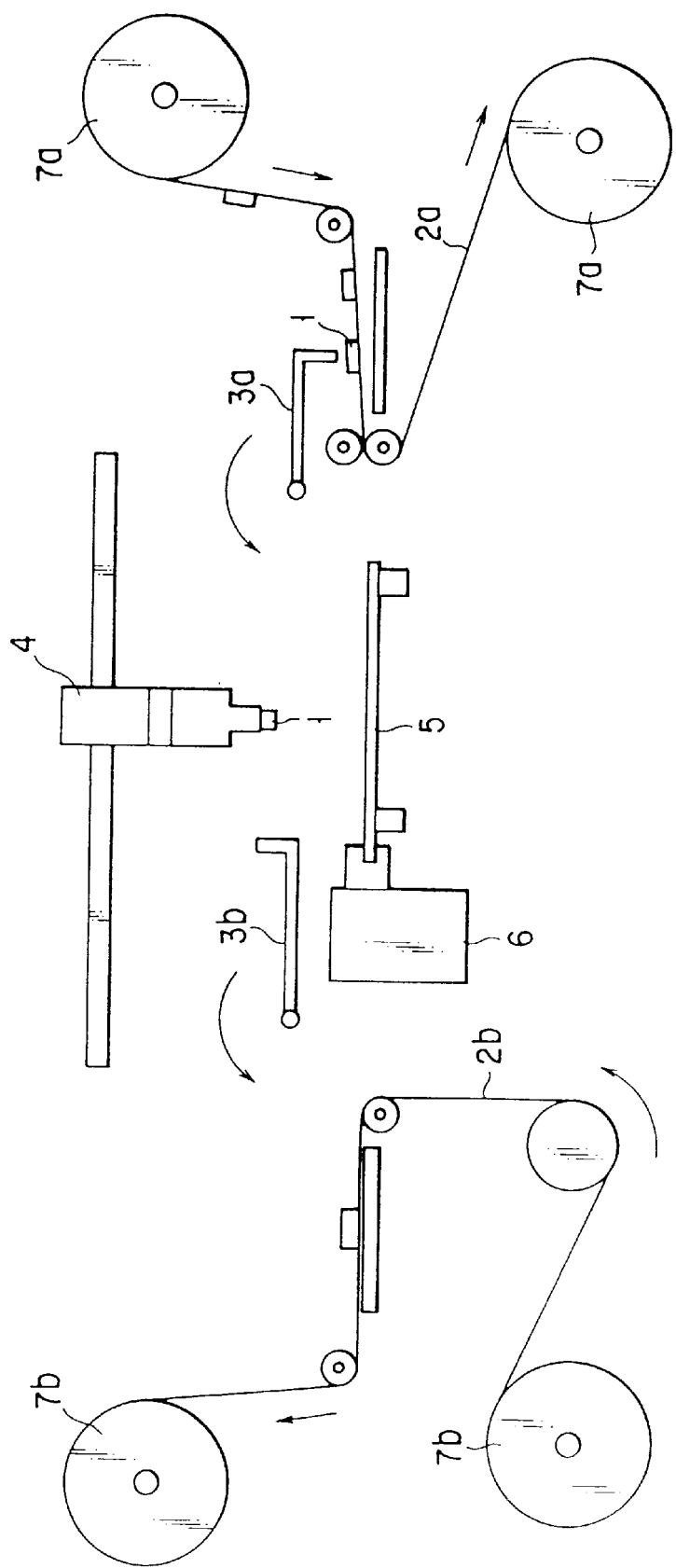
FIG. 6 is a view showing a chip mounting device according to a second embodiment of the present invention.
Figure 8A:
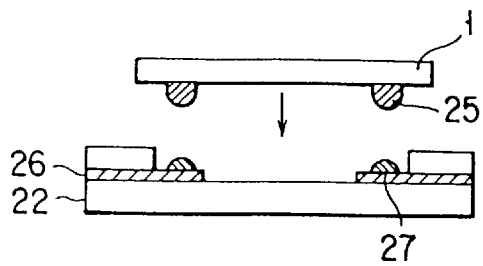
FIGS. 8A to 8C are views showing a conventional method for mounting a bare chip on a carrier by soldering.
Figure 8B:
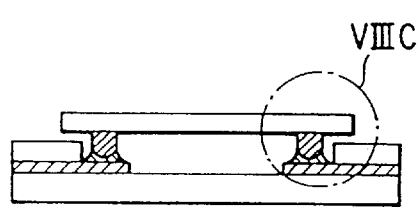
Figure 8C:
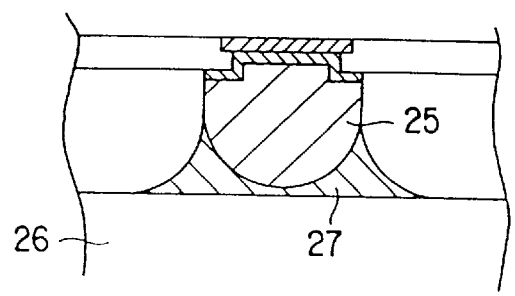
Figure 9:
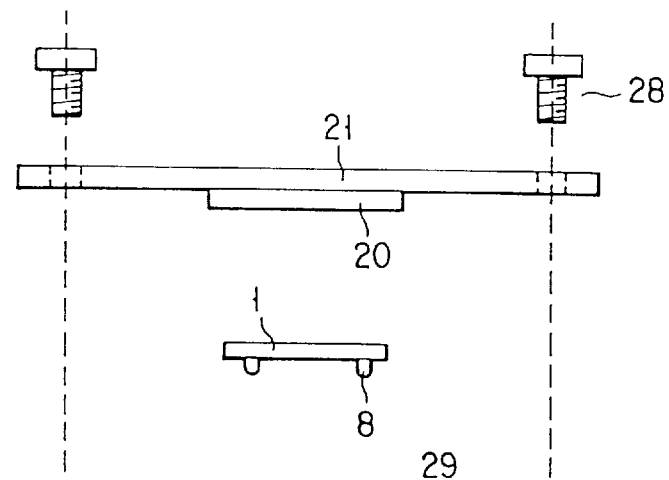
Figure 9:
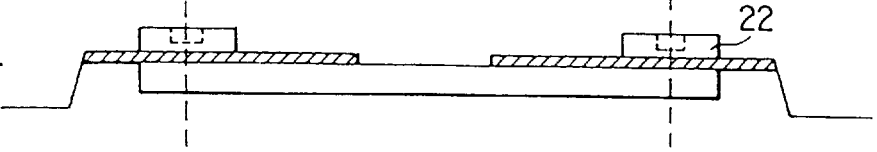

FIG. 6 shows a second embodiment of the present invention. The chip mounting device includes two conveying mechanisms 7a, 7b and two reel tapes 2a, 2b. The arrangement of the second embodiment is the same as that of the first embodiment except for the conveying mechanism and reel tape.

According to the present embodiment, it is possible to obtain the same advantage as in the first embodiment and it is also possible to group the tapes into two groups: one for conveying pre-tested chips tape 2a and the other for conveying post-tested chips tape 2b.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reel tape, comprising:

a base tape to be wound in a reel;

a chip mounting section on the base tape, on which a bare chip is to be mounted;

an adhesive layer coated on the chip mounting section, the adhesive layer permitting a bare chip to be selectively bonded to and detached from the chip mounting section;

a protection bar provided on the base tape and along the chip mounting section in a direction substantially parallel to a tape conveying direction, the protection bar preventing the bare chip from contacting an overlaying portion of the base tape when the base tape is wound; and a tape bending area having a groove formed on the base tape at an end of the chip mounting section in a direction substantially perpendicular to the tape conveying direction.

2. The reel tape according to claim 1, further comprising perforation holes formed in the base tape and aligned along an edge of the base tape substantially in the tape conveying direction.

3. A reel tape comprising:

a base tape to be wound in a reel;

a chip mounting section on the base tape, on which a bare chip is to be mounted;

an adhesive layer coated on the chip mounting section, the adhesive layer permitting a bare chip to be selectively bonded to and detached from the chip mounting section; and a protection section provided along an edge of the base tape in a direction substantially parallel to a tape conveying direction, the protection section being formed such that the edge of the base tape is corrugated in the tape conveying direction, for preventing the chip mounting section from bending when the base tape is wound.

4. The reel tape according to claim 3, further comprising at least a perforation hole formed in an area of the base tape between the chip mounting section and the protection section.

\* \* \* \* \*